(12) United States Patent
Oya

(10) Patent No.: US 7,192,801 B2
(45) Date of Patent: Mar. 20, 2007

(54) PRINTED CIRCUIT BOARD AND FABRICATION METHOD THEREOF

(75) Inventor: Yoichi Oya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/165,173

(22) Filed: Jun. 23, 2005

(65) Prior Publication Data

US 2005/0239236 A1    Oct. 27, 2005

Related U.S. Application Data

(62) Division of application No. 10/459,879, filed on Jun. 12, 2003, now Pat. No. 6,949,836.

(30) Foreign Application Priority Data

Jun. 26, 2002    (JP)    ............... 2002-185931

(51) Int. Cl.
    *H01L 21/00*    (2006.01)
(52) U.S. Cl. .................. 438/55; 438/106; 257/E21.499
(58) Field of Classification Search ................. 438/55, 438/106
    See application file for complete search history.

(56) References Cited

U.S. PATENT DOCUMENTS

| 6,143,496 | A | 11/2000 | Brown et al. |
| 6,214,644 | B1 | 4/2001 | Glenn |
| 6,504,096 | B2 * | 1/2003 | Okubora .................... 174/52.2 |
| 6,534,901 | B1 * | 3/2003 | Tsuzuki et al. ............. 310/348 |
| 6,562,662 | B2 | 5/2003 | Shishido et al. |
| 6,569,710 | B1 * | 5/2003 | Pierson ....................... 438/110 |
| 2003/0080437 | A1 | 5/2003 | Gonzalez et al. |

FOREIGN PATENT DOCUMENTS

| JP | 61-1123399 | 5/1986 |
| JP | 06-045763 | 2/1994 |
| JP | 06-140525 | 5/1994 |
| JP | 07 099420 | 4/1995 |
| JP | 07-122670 | 5/1995 |
| JP | 08-274575 | 10/1996 |
| JP | 09-074329 | 3/1997 |
| JP | 09-148466 | 6/1997 |
| JP | 11-045955 | 2/1999 |
| JP | 2001-230515 | 8/2001 |
| JP | 2002-124589 | 4/2002 |

\* cited by examiner

*Primary Examiner*—W. David Coleman
(74) *Attorney, Agent, or Firm*—Robert J. Depke; Rockey, Depke, Lyons & Kitzinger LLC.

(57) ABSTRACT

The present invention provides a printed circuit board which is capable of air-tightly sealing a functional surface of a device and of preventing excessive stress from acting on the device itself or a conductive bump conjugating the device with a wiring board and a method of fabricating the printed circuit board. The printed circuit board has a device mounted in a hollow formed in a wiring board via a plurality of conductive bumps. In the printed circuit board, a gap is formed between a functional surface of the device and an inner surface of the hollow, and a sealing member is disposed around side surfaces of the device so as to air-tightly isolate the gap and a space within the hollow excepting the gap.

4 Claims, 7 Drawing Sheets

PRINTED CIRCUIT BOARD AND FABRICATION METHOD THEREOF

CROSS REFERENCES TO RELATED APPLICATIONS

The subject matter of application Ser. No. 10/459,879 is incorporated herein by reference. The present application is a divisional of U.S. application Ser. No. 10/459,879, filed Jun. 12, 2003, now U.S. Pat. No. 6,949,836 which claims priority to Japanese Patent Application No. JP2002-185931, filed Jun. 26, 2002. The present application claims priority to these previously filed applications.

BACKGROUND OF THE INVENTION

1. Field of the Invention

The present invention relates to a printed circuit board having a structure in which a device is embedded in a cavity in a wiring board and a fabrication process thereof, in particular, to a printed circuit board having a structure air-tightly isolating a first space on a side of a functional surface and a second space other than the first space and a fabrication process thereof.

2. Description of Related Art

Conventionally, a device, such as a surface acoustic wave (SAW) device, a functional surface of which cannot be directly covered with a sealing member and which should be provided with a cavity on a side of the functional surface, has been air-tightly sealed using weld-sealing or ceramic package so as to be mounted on a surface of a wiring board as a single component.

Since mounting of such a sealed device is limited only to an outermost surface of the wiring board, and further, the device is packaged, an area required for the mounting is larger than that of the size of the original device (bear-chip size). However, the outermost surface has a limited area for mounting parts, and it cannot meet recent demands for miniaturization of the whole wiring board and for higher density mounting.

In view of this, as a method for realizing mounting of more pieces of parts as well as miniaturizing the wiring board, one including forming a hollow in an inner layer of the wiring board and mounting a bear chip being not packaged in the hollow is disclosed in Japanese Patent Application Publication Laid-Open No. Sho 61-112399, for example.

FIG. 10 shows a cross-sectional view of a main portion of a printed circuit board 30. The printed circuit board 30 has a wiring board 40 comprising three substrates 36, 37 and 38 and a device 41 mounted in the wiring board 40 in a state of being a bear chip.

The device 41 is mounted in the wiring layer in a condition that a functional surface 46 thereof faces down in a hollow 47 formed in the substrate 36. The device 41 is electrically connected to an inner wiring formed in the substrate 37 through a plurality of conductive bumps 44. The conductive bumps 44 may include a solder bump, a gold stud bump, and the like. Therefore, a gap g' as large as a height of the conductive bump 44 (several tens μm, for example) is formed between an inner surface 45 of the hollow 47 and the functional surface 46.

However, such a structure provides insufficient reliability since the conductive bumps 44 are not protected with a resin or the like. The device 41 comprising a semiconductor or a ceramic has a thermal expansion coefficient largely different from that of the wiring board 40 comprising an organic material, which is currently popularly used. Accordingly, the conductive bumps 44 functioning as a junction between the device 41 and the wiring board 40 receive concentrated stress so that cracks are easily occurred in the bumps 44 and the bumps 44 are easily removed from the device 41 and/or the wiring board 40. Particularly, since the conductive bumps 44 used in a case of mounting the bear-chip device 41 facing down are small in size and short in height, it is required to make up for the strength of the bump junctions.

On the other hand, Japanese Patent Application Publication No. Hei 8-274575 discloses a structure in which all spaces, other than a part which the functional surface 46 faces toward within the gap g', is sealed with a resin 61 in the hollow 47, as shown in FIG. 11, for example. This structure ensures the reliability of the conductive bumps 44 by dispersing the stress concentrated on the bumps 44 over the resin 61.

However, the structure of FIG. 11 possibly brings a problem of the stress affecting on the device 41 through the resin 61. The stress includes a thermal stress. In general terms, a resin material shows its large thermal shrinkage. The stress caused by the thermal shrinkage of the resin 61 acts on the device 41 which the resin 61 contacts with. Mechanical stress may easily act on the device 41 as well as the thermal stress. A case of employing a SAW device for the device 41 will be considered herein. The SAW device is frequently incorporated in a cellular phone as a filter device. In the cellular phone, the wiring board 40 easily deforms due to operation on buttons or keys. The stress caused by the deformation of the wiring board 40 acts on the device 11 indirectly contacting with the wiring board 40 via the resin 61 disposed therebetween. In particular, since materials including $LiTaO_3$ used for SAW devices are weaker than a silicon semiconductor and are easily broken, it is necessary to avoid stress acting on the device 41 employing such materials.

SUMMARY OF THE INVENTION

The present invention has been made in view of the above-described disadvantages in the conventional technique to provide a printed circuit board in which a functional surface of a device can be air-tightly sealed and an excessive stress acting on the device itself or a conductive bump functioning as a junction between the device and a wiring board can be avoided, and a fabrication method of the printed circuit board.

The printed circuit board of the present invention has a device mounted in a hollow formed in a wiring board via a plurality of conductive bumps. In the printed circuit board, a gap is formed between a functional surface of the device and an inner surface of the hollow, and a sealing member is disposed around side surfaces of the device so as to air-tightly isolate the gap and a space within the hollow other than the gap.

A method for fabricating a printed circuit board of the present invention comprises a step of forming around side surfaces of a device a sealing member air-tightly isolating a gap between a functional surface of the device and an inner surface of a hollow and a space within the hollow excepting the gap.

It is enough for the sealing member to be formed to realize airtight sealing of the functional surface of the device and relaxing of the stress onto the conductive bumps. The sealing member is not formed excessively. Therefore, the functional surface of the device and an outer surface of the device excepting the functional surface thereof face to the wiring board having a gap or a space therebetween, which result in suppressing the stress due to a thermal deformation or a mechanical deformation of the wiring board acting on the device.

In addition, a connecting path formed for connecting the space within the hollow other than the gap on the side of the functional surface to outside of the wiring board makes the hollow unclosed. Accordingly, even if the wiring board is heated during a fabrication process, it is possible to avoid expansion of the hollow due to rapid evaporation of moisture in the wiring board and to make the wiring board release heat generated from the device under operation.

Furthermore, if the inner surface of the hollow is covered with a hydrophobic material, it is possible to prevent moisture from permeating from the inner surface of the hollow into the wiring board.

The sealing member may be composed of a resin or a rubber. Any of a thermosetting resin, a UV-curable resin, and a thermoplastic resin may be used as the resin. Alternatively, an acrylic resin of UV-thermo curable type may also be used. In particular, an epoxy resin excellent in adhesiveness, water-resistance, withstand voltage performance or the like and a silicon resin having small elasticity and excellent in heat-cycle characteristics are preferably used. In a case of using a thermosetting resin whose major component is an epoxy resin, a curing agent, a filler, a gelating agent may be added if necessary. The curing agent may include those of amine-type and acid anhydride-type, for example. The filler may include silic acid, alumina and silica and may be used for reducing a thermal expansion coefficient and for reducing absorption rate. The gelating agent can control fluidity of the resin.

The sealing member may be formed through the Dispense method directly dispensing a material from a syringe or through the screen-printing process.

Furthermore, the sealing member formed by a plurality of steps, not in a single step, may effectively reduce distortion of the sealing member caused at the time of curing and prevent itself from flowing into the functional surface side. By way of example, first, a first sealing member with a relatively high viscosity may be formed in a small quantity. Then, a space which was not sealed with the first sealing member may be completely sealed with a second sealing member in a larger quantity. The first sealing member may function to suppress the second sealing member to flow into the functional surface side and may ensure the air-tightly sealed gap on the functional surface side.

Alternatively, the first sealing member may be a silicon resin and the second sealing member may be an epoxy resin. In this case, the silicon resin which repels the epoxy resin prevents the second sealing member from flowing into the functional surface side. Furthermore, the device may be mounted after having formed a sealing member in advance so as to prevent the sealing member flowing into the functional surface side. In this case, an additional sealing member formed after mounting the device may realize complete airtight sealing.

A sealing member may be formed on a device in a manner of keeping away of a functional surface thereof before mounting the device. According to the process of forming the sealing member before mounting the device, in a case of employing a thermosetting resin as the sealing member and a solder is used for the conductive bump, a step of heat curing the sealing member can be carried out at the same time as a reflow step so that the number of process steps can be reduced. Besides, it is effective to use a sealing member having a relatively high thixo index at normal temperatures for prohibiting flow of the sealing member into the functional surface side.

As described above, according to the present invention, locally forming a sealing member in a hollow in which a device is accommodated avoids excessive stress acting on the device and realizes airtight sealing of a functional surface of the device and protection of a conductive bump. Thus, according to the present invention, miniaturization of a printed circuit board and high density mounting can be accomplished, without deteriorating reliability of the device.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Now, preferred embodiments of the present invention will be described with reference to the attached drawings.

(First Embodiment)

Figure 1:
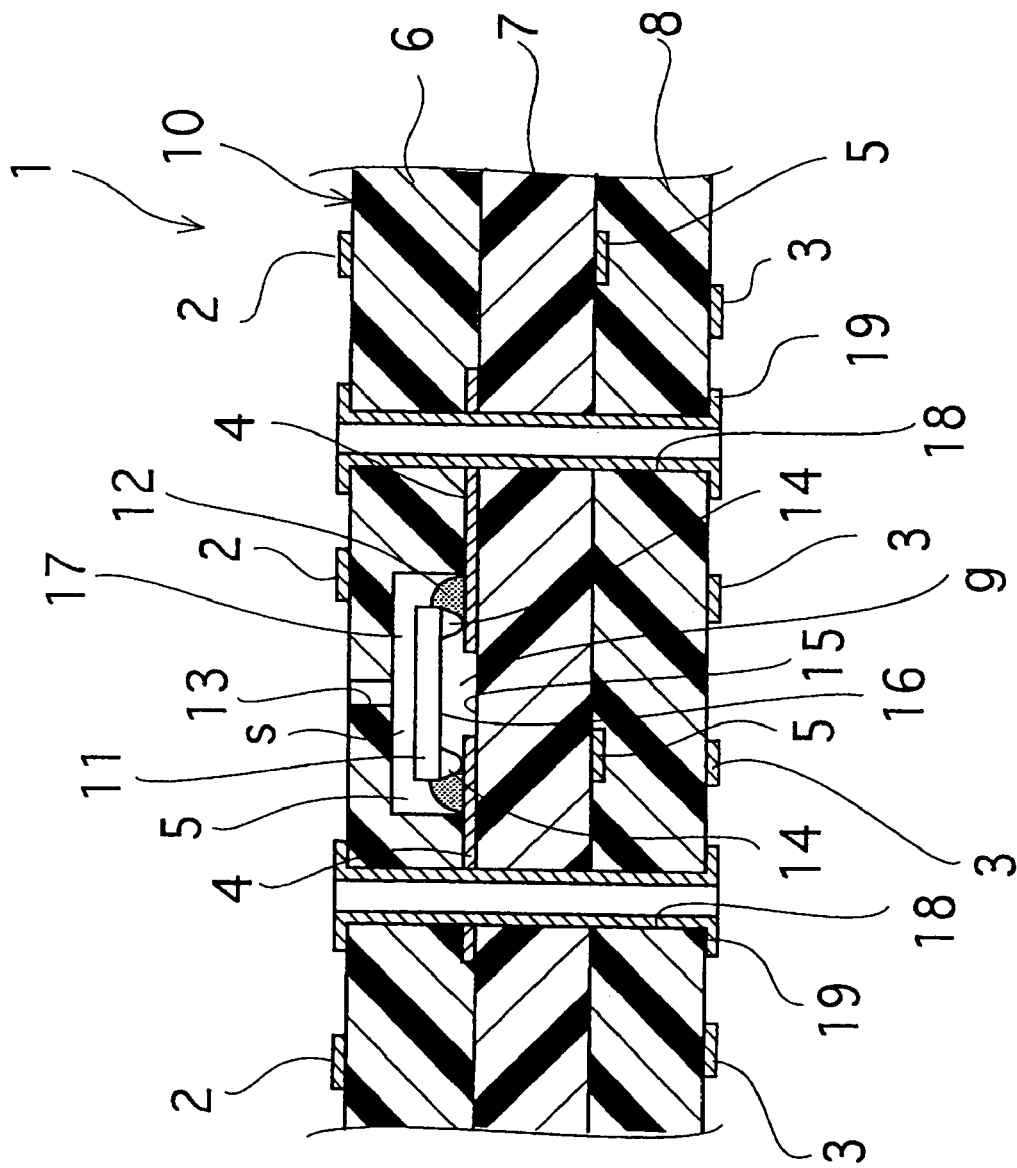
FIG. 1 is a cross-sectional view of a main portion of a printed circuit board according to a first embodiment of the present invention.

FIG. 1 shows a cross-sectional view of a main portion of a printed circuit board 1 according to a first embodiment of the present invention. The printed circuit board 1 has a wiring board 10 comprising three substrates 6, 7 and 8 and a device 11 mounted in the wiring board 10 in a state of being a bear chip. The wiring board 10 is a multilayer printed circuit board having two outer layer wirings 2 and 3 and two inner layer wirings 4 and 5.

The device 11 is mounted in the wiring layer in a condition that a functional surface 16 thereof faces down in a hollow 17 formed in the substrate 6. The device 11 is electrically connected to the inner layer wiring 4 formed in the substrate 7 with a plurality of conductive bumps 14. The conductive bumps 14 may include a solder bump, a gold stud bump, and the like. Therefore, a gap g as large as a height of the conductive bump 14 (several tens of μm, for example) is formed between an inner surface 15 of the hollow 17 and the functional surface 16.

Furthermore, a sealing member 12 is formed so as to cover around side surfaces of the device 11. The gap g and a space s within the hollow 17 other than the gap g are air-tightly isolated with the sealing member 12.

In specific, the device 11 is a surface acoustic wave device (SAW device) in the present embodiment. A case of using the SAW device 11 as a filter device will be described with reference to FIG. 9.

Figure 9:
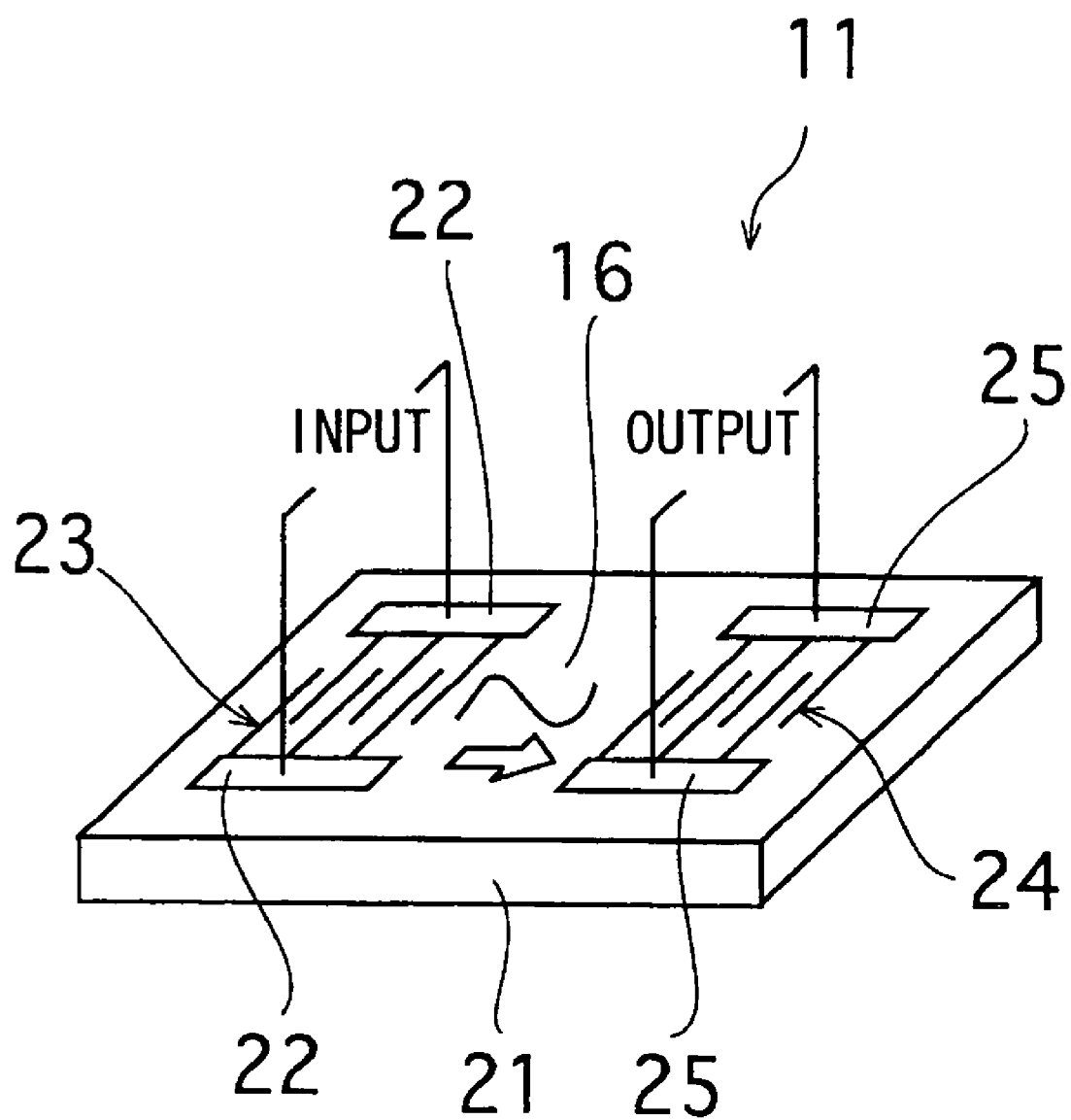
FIG. 9 is a schematic view of a surface acoustic wave (SAW) device.
Figure 10:
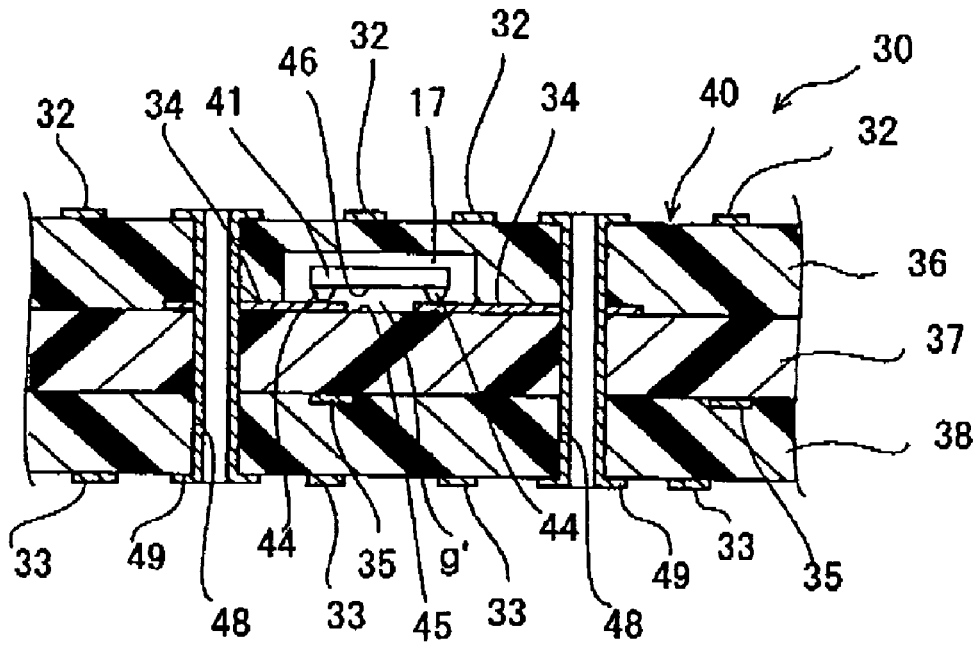
FIG. 10 is a cross-sectional view of a main portion of a conventional printed circuit board.
Figure 11:
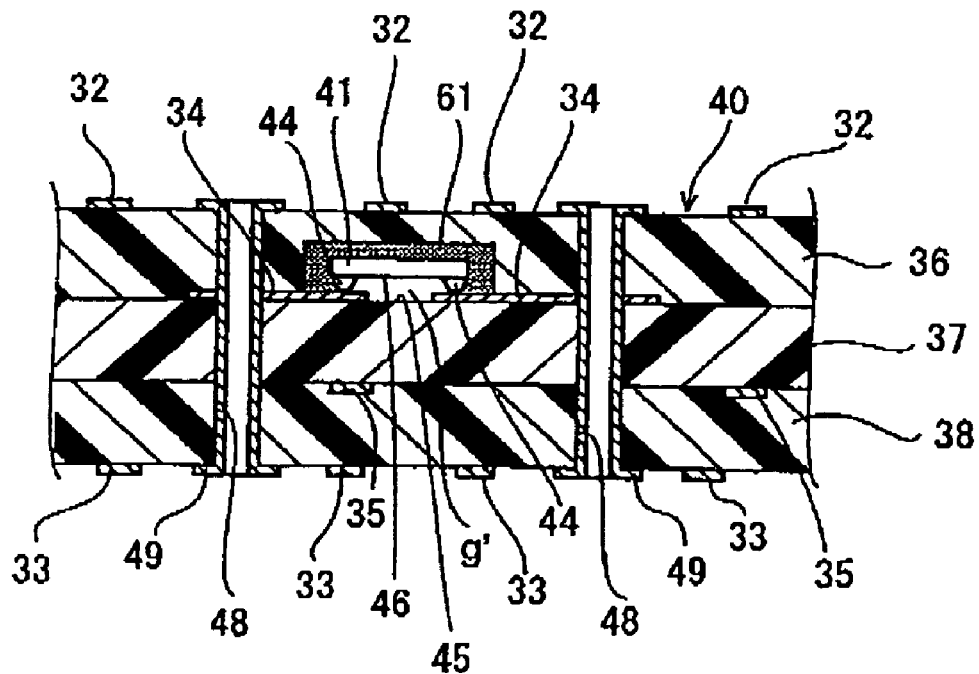
FIG. 11 is a cross-sectional view of a main portion of another conventional printed circuit board.

As shown in FIG. 9, the SAW device 11 comprises a piezoelectric substrate 21 which may be composed of $LiTaO_3$, $LiNbO_3$ and a crystal and interdigital transducers (IDT) 23 and 25 which may be composed of Al and Au formed on the functional surface 16 of the piezoelectric substrate 21. When a high frequency voltage is applied to an electrode pad 22 connected to the input IDT 23, a surface of the piezoelectric substrate 21 on which the input IDT 23 is formed deforms to generate a surface acoustic wave. This surface acoustic wave spreads on the surface of piezoelectric substrate 21 to reach the output IDT 24. A band-limited output can be obtained from an electrode pad 25 connected to the output IDT 24 which received the surface acoustic wave.

Next, a method of fabricating the printed circuit board 1 will be described with reference to FIGS. 2 to 5

First, a copper foil is attached or a copper plating is directly applied on both surfaces of the substrate 7 composed of an epoxy resin or the like to have a double-sided copper-clad laminated plate.

Subsequently, after sticking a dry film on the copper foil, a mask having a desired circuit pattern is stacked thereon. Then, the dry film is exposed and developed in a developing solution. According to the steps, an opening is selectively formed on the dry film in accordance with the desired circuit pattern.

Subsequently, using the dry film as a mask, copper foil is wet-etched by means of an etching solution. According to the process, the wirings 4 and 5 can be obtained (see FIG. 2).

Figure 2:
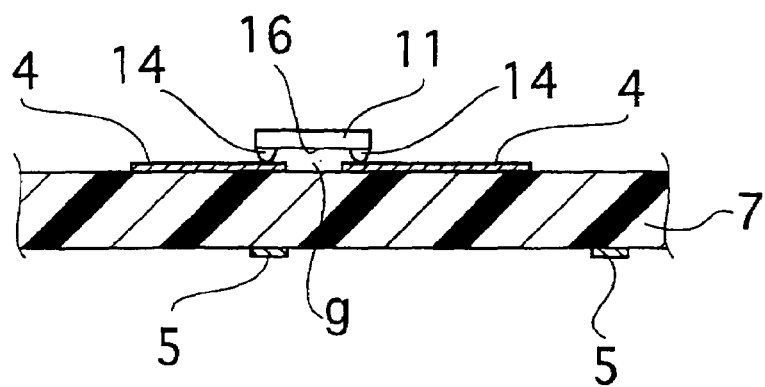
FIG. 2 is a cross-sectional view showing a fabrication step of the printed circuit board according to the first embodiment.

Next, as shown in FIG. 2, the device 11 is mounted on the substrate 7 in a face-down manner with its functional surface facing down. On the functional surface 16 side, a plurality of conductive bumps 14 are formed in correspondence with the electrode pads 22 and 25 shown in FIG. 9. By bonding these conductive bumps 14 after positioning them on the wiring 4, the electrode pads 22 and 25 are electrically connected to the wiring 4 through the conductive bumps 14.

Figure 3:
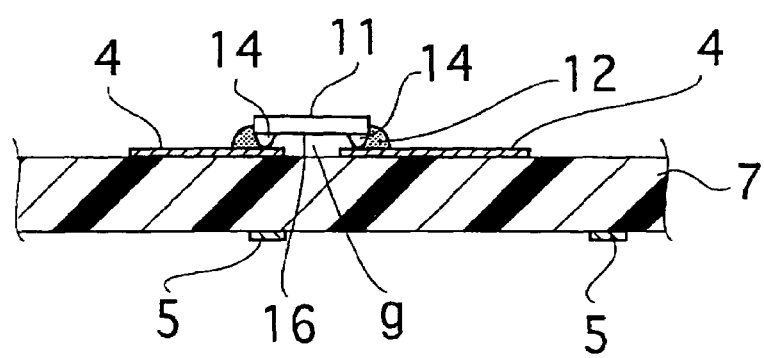
FIG. 3 is a cross-sectional view showing a fabrication step subsequent to that shown in FIG. 2.
Figure 5:
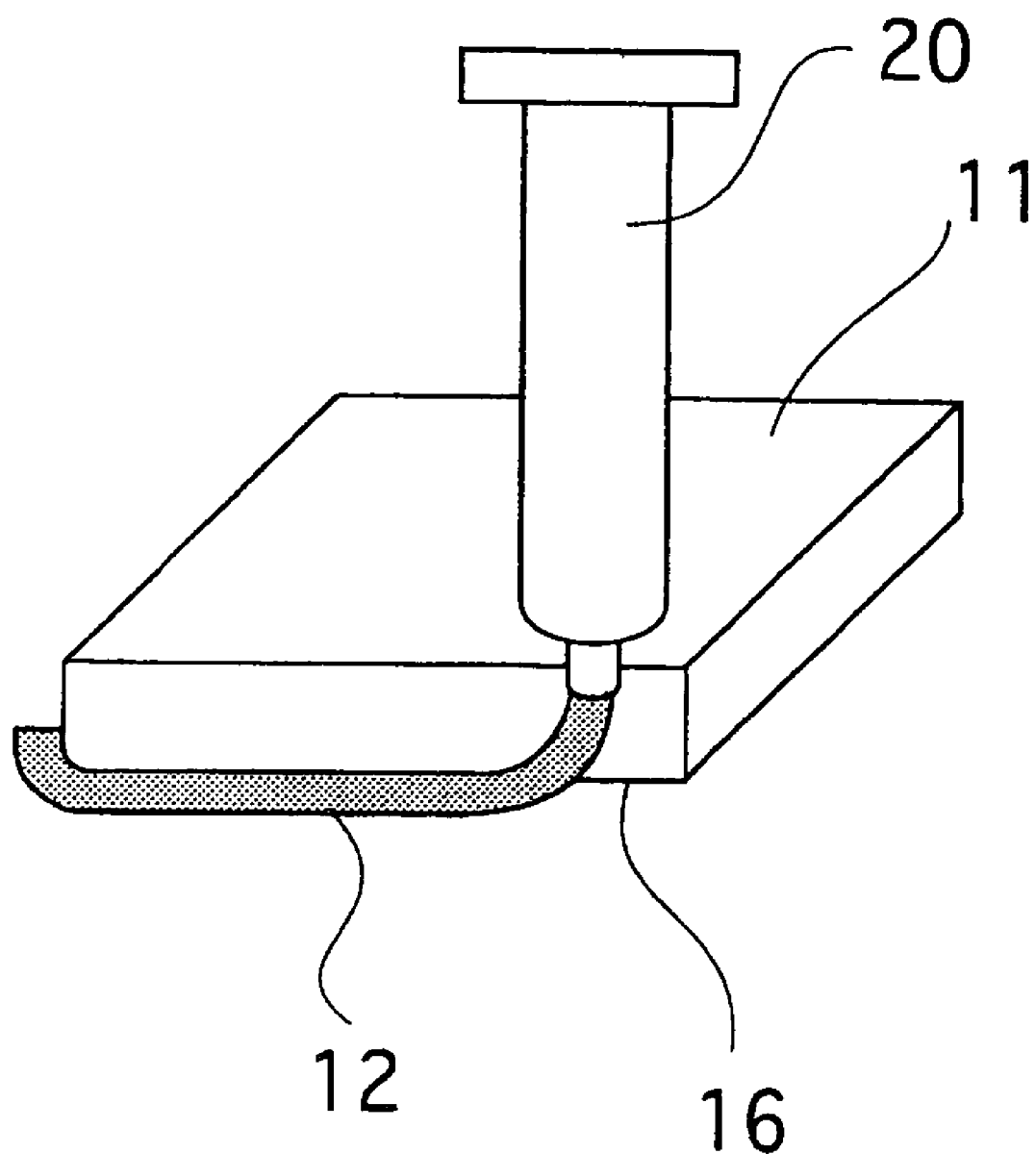
FIG. 5 is a view explaining a method of forming a sealing member using a syringe.

Subsequently, as shown in FIG. 3, the sealing member 12 is formed so as to cover around the plurality of conductive bumps 14. Here, the sealing member 12 is a thermosetting resin (epoxy resin or the like) having fluidity. As shown in FIG. 5, for example, the sealing member 12 is discharged from a syringe 20 little by little so as to have a ring-shape embedding spaces between the plurality of conductive bumps 14 along four side surfaces of the device 11 and is cured by heat. By means of this sealing member 12, a gap between the functional surface 16 and the substrate 7 becomes a space air-tightly sealed and isolated from outside.

A viscosity of the sealing member 12 is 120 [Pa·s] (rotor RPM of 50 rpm), a thixo index (5 rpm/50 rpm) thereof is 2.4, a gel time (time duration after mixing it until it is gelated) thereof is 10 minutes (120° C.), and a quantity of volatilization at the time of hardening is 0.3 weight % or less (110° C.), for example.

Figure 4:
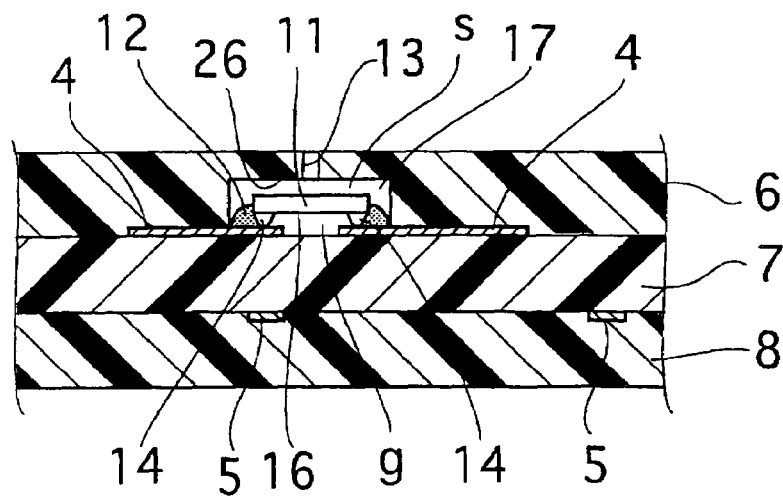
FIG. 4 is a cross-sectional view showing a fabrication step subsequent to that shown in FIG. 3.

Next, as shown in FIG. 4, the substrates (prepregs) 6 and 8 are stacked on both surfaces of the substrate 7, respectively, and a copper foil is stacked on each of the substrates 6 and 8. Then, the substrates are sandwiched between heater plates and are pressed and heated.

The substrate 6 which is stacked on the side of the device 11 has a recess 26. The recess 26 forms a hollow 17 for accommodating the device 11 between the substrate 6 and the substrate 7. Furthermore, a connection path 13 is formed at a bottom of the recess 26. The connection path 13 connects a space s to outside of the substrate 6. The space s is a space within the recess 26 except for the air-tightly sealed gap g which the functional surface 16 faces.

The hollow 17 and the connection path 13 may be preliminarily formed in the substrate 6 before stacking the substrate 6 on the substrate 7. By way of example, a mechanical processing using a grinding tool such as a drill, a laser processing, an etching or the like is carried out for forming the hollow 17 and the connection path 13. Alternatively, the connection path 13 may be formed after stacking the substrate 6 on the substrate 7.

Subsequently, after sticking a dry film on the copper foil stuck on each of the surfaces of the substrates 6 and 8, a mask having a desired circuit pattern is stacked thereon to expose the dry film. Thereafter, the dry film is developed in a developing solution so that an opening is selectively formed depending on the desired circuit pattern on the dry film.

Subsequently, using the dry film as a mask, copper foil is wet-etched by means of an etching solution. According to this processing, desired copper foil patterns 2 and 3 can be obtained (see FIG. 1).

Subsequently, a through hole 18 is formed by drilling, and a copper plating 19 is put on the through hole 18 to have the printed circuit board 1 as shown in FIG. 1 is completed. In addition to the device 11 shown in the figures, the other surface mounted parts and embedded parts similar to the device 11 are also mounted on the printed circuit board 1.

As described above, according to the embodiment of the present invention, the sealing member 12 locally covering around the conductive bumps 14 protects the conductive bumps 14, and it also protects the functional surface 16 of the device 11 from moisture or the like by air-tightly sealing it. Thus, the IDTs 23 and 24 (see FIG. 9) formed on the functional surface 16 can be prevented from corroding. In addition, since the functional surface 16 of the device 11 faces the wiring board 10 in non-contact having the gap g therebetween, and the other surface of the device 11 faces the wiring board 10 in non-contact having the space s therebetween, the stress acting from the wiring board 10 to the device 11 can be suppressed. Furthermore, if the resin flows during laminating the substrates 6, 7 and 8 by heat pressing, the resin is prevented from flowing into the gap g due to the presence of the sealing member 12.

In addition, even if the moisture in the wiring board 10 is heated and evaporates rapidly in the hollow 17 at the time of reflowing the other surface mounting parts, it is possible to discharge the resultant vapor through the connection path 13 to the outside so that the hollow 17 does not expand and the hollow 17 and the device 11 can be protected from being damaged. The sealing member 12 can block moisture and dust coming into the hollow 17 through the connecting path. Furthermore, the connection path 13 also functions to improve heat radiation in the hollow 17.

(Second Embodiment)

The connection path 13 connecting to the outside of the wiring board 10 in the above first embodiment may allow moisture coming into the hollow 17. In particular, in a case where the substrate 6 comprises a material composed of glass fiber impregnated with a resin, which is frequently used, and the hollow 17 is formed by drilling, the glass fiber facing the inner surface of the hollow 17 easily gets frayed. And, if the moisture comes into the hollow 17, the moisture permeates along the glass fiber from a portion the glass fiber got frayed into inside of the wiring board 10, which may result in deterioration of insulation of the wiring board 10.

Accordingly, in a second embodiment of the present invention, the inner surface 15 of the hollow 17 is covered with a hydrophobic material. According to the arrangement, the moisture is prevented from permeating from the inner surface 15 of the hollow 17 to inside of the wiring board 10.

The hydrophobic material may include a $Si_3N_4$ film formed by the plasma CVD at 250° C.; a SiC film, a $Si_3N_4$ film and a BN film formed by sputtering; a DLC (diamond like carbon) film formed by the plasma CVD at room temperature and the like.

(Third Embodiment)

Figure 6A:
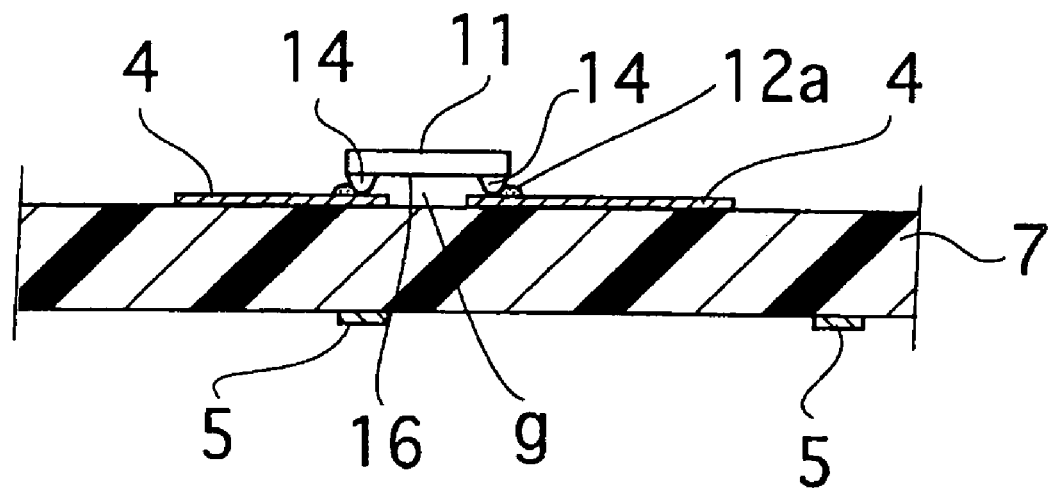
FIGS. 6A and 6B are cross-sectional views of steps of forming a sealing member in two steps in a third embodiment of the present invention.
Figure 6B:
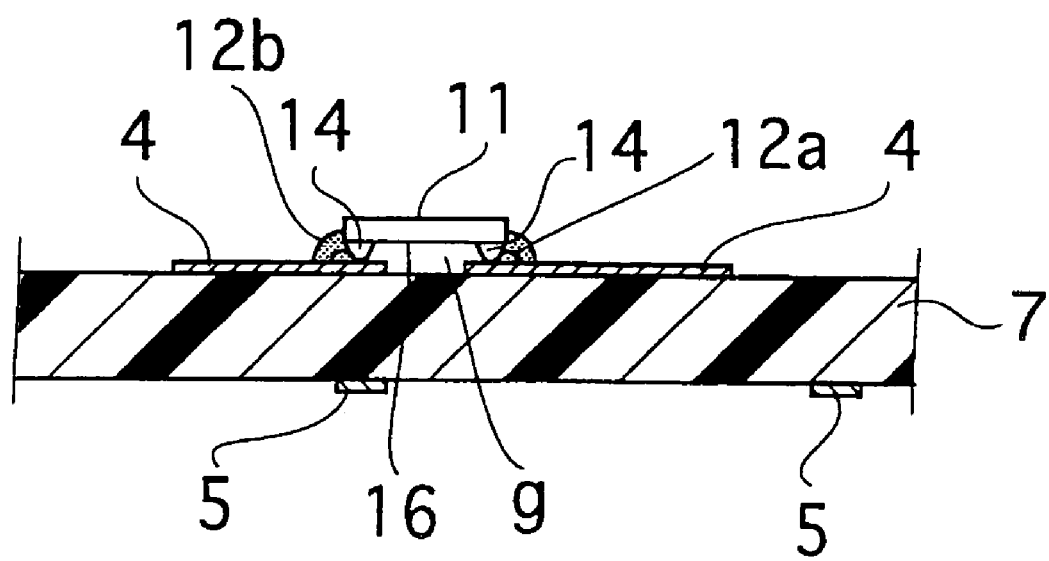

In the present embodiment, as shown in FIGS. 6A and 6B, a sealing member 12 is formed in two steps. First, as shown in FIG. 6A, a sealing member 12a with a small quantity is formed. Subsequently, as shown in FIG. 6B, a sealing member 12b is formed so as to air-tightly seal the gap g completely by filling portions not sealed with the sealing member 12a. At this time, the sealing member 12a formed first functions to stop the sealing member 12b flowing into the gap g. It is effective that a material having a relatively high viscosity and having a small fluidity with a small quantity is used for the sealing member 12a. Forming the sealing member in two steps is also effective in suppressing distortion at the time the sealing member is cured. Of course, the process may be divided into three or more steps, not limited to two steps.

Although embodiments of the present invention have been explained in the above description, the present invention is not limited thereto and various modifications in accordance with the technical idea of the present invention may also be possible.

Alternatively, different from the above-mentioned fabrication process, after preparing a multilayer printed circuit board having a preliminarily provided recess, a device may be mounted in the recess, side surfaces of the device may be sealed with a resin and the recess may be covered with another substrate so as to obtain a hollow having the device sealed therein.

Figure 7:
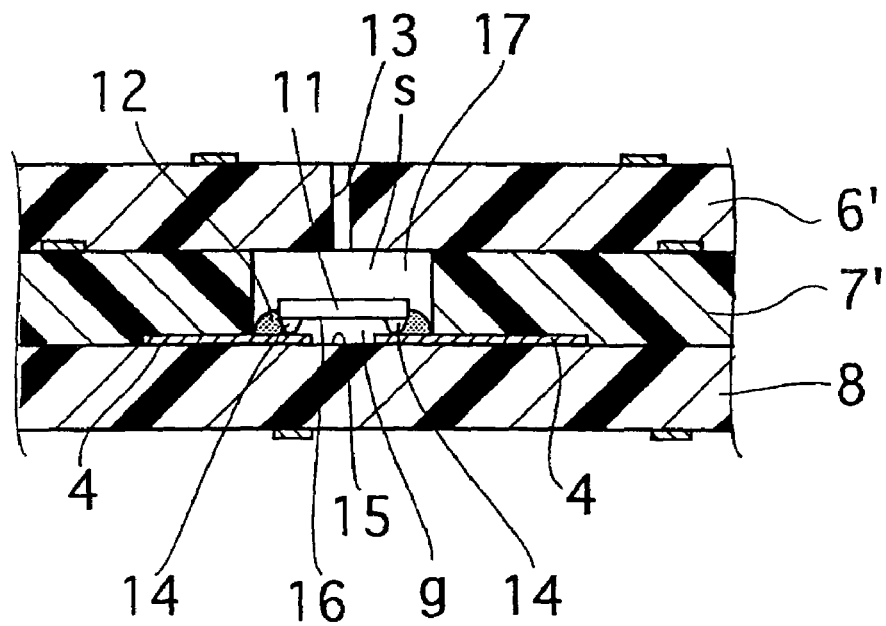
FIG. 7 is a cross-sectional view of a main portion of a printed circuit board according to a modified example.

As shown in FIG. 7, after mounting the device 11 on the substrate 8, a substrate 7' having a through-hole formed therein may be stacked thereon and a substrate 6' may be stacked further thereon so as to cover the through-hole so as to form the hollow 17.

Figure 8:
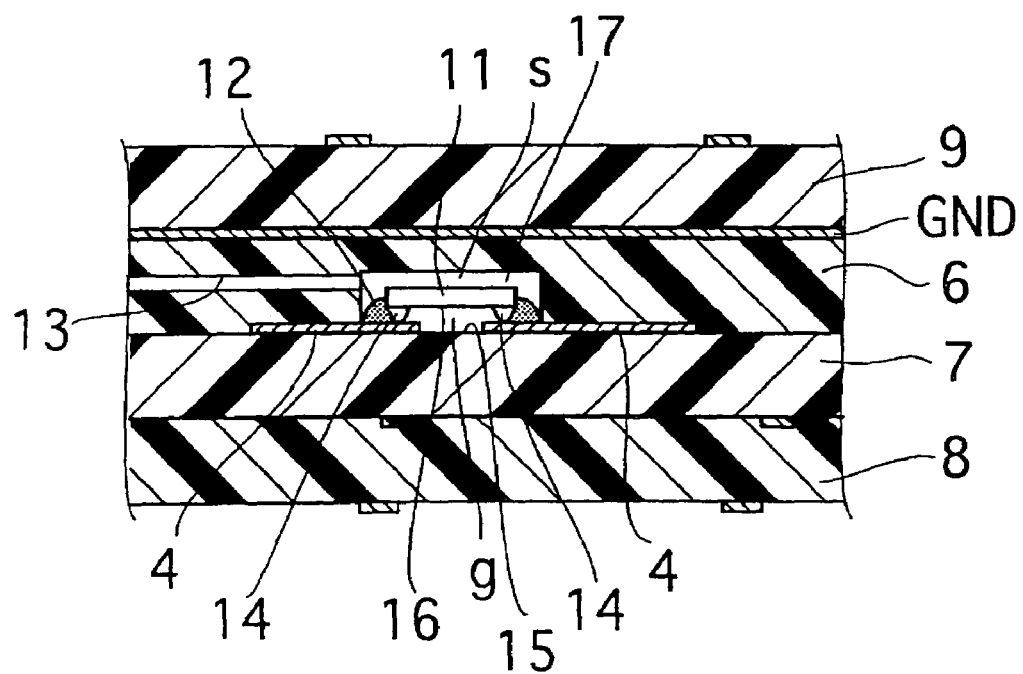
FIG. 8 is a cross-sectional view of a main portion of a printed circuit board according to another modified example.

Alternatively, the connection path 13 may be formed in a horizontal direction of the substrate 6 as shown in FIG. 8.

Furthermore, as shown in FIG. 8, embedding the device 11 in the vicinity of a solid plane ground pattern GND formed between the substrate 9 and the substrate 6 may bring an electromagnetic shield effect by the ground pattern GND. Since the ground pattern GND also functions as a ground pattern GND necessary for the circuit construction, it is not necessary to form an additional shield structure, and it is possible to easily obtain the electromagnetic shield effect and to effectively improve moisture resistance of the printed circuit board.

The device 11 is not limited to the SAW device. The present invention can also be applied to a MEMS (Micro Electro Mechanical Systems) device formed by processing a silicon substrate or a thin film stacked on the silicon substrate to have a sensor or a movable parts (a motor, an actuator or the like) and to a magnetic functional device in which a magnetization direction of a magnetic thin film is changed depending on distortion or stress.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method of fabricating a printed circuit board in which a device is mounted in a cavity formed in a wiring board via a plurality of conductive bumps and a gap is formed between a surface of said device and an inner surface of said cavity, said method comprising the step of forming a sealing member around side surfaces of said device at a position of said conductive bumps so as to air-tightly isolate said gap and a space within said cavity other than the gap.

2. The method of fabricating a printed circuit board as claimed in claim 1, further comprising the step of forming a connection path for connecting said space within said cavity other than the gap to outside of said wiring board in said wiring board.

3. The method of fabricating a printed circuit board as claimed in claim 1, further comprising the step of covering the inner surface of said cavity with a hydrophobic material.

4. The method of fabricating a printed circuit board as claimed in claim 1, wherein said sealing member is formed in a plurality of steps.

* * * * *